US012324236B2

(12) United States Patent
Seshadri et al.

(10) Patent No.: US 12,324,236 B2
(45) Date of Patent: Jun. 3, 2025

(54) BOTTOM CONTACT FOR STACKED GAA FET

(71) Applicant: INTERNATIONAL BUSINESS MACHINES CORPORATION, Armonk, NY (US)

(72) Inventors: Indira Seshadri, Niskayuna, NY (US); Stuart Sieg, Albany, NY (US); Su Chen Fan, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 650 days.

(21) Appl. No.: 17/522,015

(22) Filed: Nov. 9, 2021

(65) Prior Publication Data

US 2023/0143705 A1    May 11, 2023

(51) Int. Cl.
*H10D 84/85* (2025.01)
*H01L 21/02* (2006.01)
(Continued)

(52) U.S. Cl.
CPC ....... *H10D 84/856* (2025.01); *H01L 21/0259* (2013.01); *H10D 30/031* (2025.01); *H10D 30/6713* (2025.01); *H10D 30/6729* (2025.01); *H10D 30/6735* (2025.01); *H10D 30/6757* (2025.01); *H10D 62/118* (2025.01);
(Continued)

(58) Field of Classification Search
CPC .......................... H10D 84/0186; H10D 84/856
See application file for complete search history.

(56) References Cited

U.S. PATENT DOCUMENTS 8,674,470 B1    3/2014   Or-Bach et al.
8,815,691 B2    8/2014   Colinge et al.
(Continued)

FOREIGN PATENT DOCUMENTS

EP        3588576 A1    1/2020

OTHER PUBLICATIONS

International Search Report from PCT/IB2022/060633 dated Jan. 27, 2023. (15 pages).
(Continued)

*Primary Examiner* — Douglas M Menz
(74) *Attorney, Agent, or Firm* — Tutunjian & Bitetto, P.C.; L. Jeffrey Kelly

(57) ABSTRACT

A method is presented for constructing a semiconductor device. The method includes forming a plurality of fins over a nanosheet stack and a substrate, forming spacers between the nanosheet stack and one or more of the plurality of fins, each spacer defining a different shape, forming gate spacers adjacent the plurality of fins, the gate spacers directly contacting the one or more of the plurality of fins having a spacer, forming a barrier spacer between a set of fins of the plurality of fins, the barrier spacer directly contacting a top surface of a shallow trench isolation (STI) region, forming n-type epitaxial regions between the plurality of fins, forming p-type epitaxy regions over the n-type epitaxial regions, and forming a first contact extending vertically through the semiconductor device adjacent the barrier spacer and extending laterally away from the barrier spacer to directly contact a sidewall of an n-type epitaxial region.

20 Claims, 9 Drawing Sheets

(51) Int. Cl.
*H10D 30/01* (2025.01)
*H10D 30/67* (2025.01)
*H10D 62/10* (2025.01)
*H10D 84/01* (2025.01)
*H10D 84/03* (2025.01)

(52) U.S. Cl.
CPC ....... *H10D 84/0167* (2025.01); *H10D 84/017* (2025.01); *H10D 84/0186* (2025.01); *H10D 84/038* (2025.01)

(56) References Cited

U.S. PATENT DOCUMENTS

| | | | |
|---|---|---|---|
| 9,337,264 | B2 | 5/2016 | Bangsaruntip et al. |
| 9,837,491 | B2 | 12/2017 | Rosenblatt et al. |
| 10,192,819 | B1 | 1/2019 | Chanemougame et al. |
| 10,192,867 | B1 | 1/2019 | Frougier et al. |
| 2017/0358584 | A1 | 12/2017 | Wang et al. |
| 2018/0374791 | A1 | 12/2018 | Smith et al. |
| 2019/0393352 | A1 | 12/2019 | Guha et al. |
| 2020/0044045 | A1 | 2/2020 | Wang et al. |
| 2020/0303502 | A1 | 9/2020 | Bomberger et al. |
| 2021/0175128 | A1 | 6/2021 | Gardner et al. |
| 2021/0202500 | A1 | 7/2021 | Chanemougame et al. |
| 2021/0249506 | A1* | 8/2021 | Yeh .................. H01L 21/76232 |
| 2021/0288141 | A1* | 9/2021 | Reznicek ............... H10D 30/62 |
| 2021/0408010 | A1* | 12/2021 | Lien .................. H10D 30/6757 |

OTHER PUBLICATIONS

Yin et al., "Vertical Sandwich Gate-All-Around Field-Effect Transistors With Self-Aligned High-k Metal Gates and Small Effective-Gate-Length Variation", IEEE Electron Device Letters, Nov. 2019, pp. 1-5.

Ryckaert et al. "The Complementary FET (CFET) for CMOS scaling beyond N3", IEEE Symposium on VLSI Technology, Jun. 2018, 2 pages.

* cited by examiner

BOTTOM CONTACT FOR STACKED GAA FET

BACKGROUND

The present invention relates generally to semiconductor devices, and more specifically, to methods and systems for forming a bottom contact for a stacked gate-all-around (GAA) field effect transistor (FET).

As the fin width in a finFET approaches 5 nm, channel width variations could cause undesirable variability and mobility loss. One promising transistor candidate, gate-all-around FET, could circumvent the problem. Gate-all-around is a device in which a gate is placed on all four sides of the channel. GAA is basically a silicon nanowire with a gate going around it. In some cases, the gate-all-around FET could have indium gallium arsenide (InGaAs) or other III-V materials in the channels.

SUMMARY

In accordance with an embodiment, a method is provided for constructing a semiconductor device. The method includes forming a plurality of fins over a nanosheet stack and a substrate, forming spacers between the nano sheet stack and one or more of the plurality of fins, each spacer defining a different shape, forming gate spacers adjacent the plurality of fins, the gate spacers directly contacting the one or more of the plurality of fins having a spacer, forming a barrier spacer between a set of fins of the plurality of fins, the barrier spacer directly contacting a top surface of a shallow trench isolation (STI) region, forming n-type epitaxial regions between the plurality of fins, forming p-type epitaxy regions over the n-type epitaxial regions, and forming a first contact extending vertically through the semiconductor device adjacent the barrier spacer and extending laterally away from the barrier spacer to directly contact a sidewall of an n-type epitaxial region of the n-type epitaxial regions.

In accordance with another embodiment, a method is provided for constructing a stacked gate-all-around field effect transistor (GAA FET). The method includes forming a plurality of fins over a nanosheet stack and a substrate, forming barrier spacers over shallow trench isolation (STI) regions, forming n-type epitaxial regions between the plurality of fins, forming p-type epitaxy regions over the n-type epitaxial regions, and forming a first contact extending vertically through the GAA FET and extending laterally away from the barrier spacers to directly contact a sidewall of an n-type epitaxial region of the n-type epitaxial regions.

In accordance with yet another embodiment, a stacked gate-all-around field effect transistor (GAA FET) is provided. The GAA FET includes barrier spacers disposed over shallow trench isolation (STI) regions, n-type epitaxial regions formed between the plurality of fins, p-type epitaxy regions formed over the n-type epitaxial regions, and a first contact extending vertically through the GAA FET and extending laterally away from the barrier spacers to directly contact a sidewall of an n-type epitaxial region of the n-type epitaxial regions.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming a bottom contact for a stacked gate-all-around (GAA) field effect transistor (FET).

Conventional integrated circuits incorporate 2-D planar field effect transistors (FETs) in which current flows through a semiconducting channel between a source and a drain, in response to a voltage applied to a control gate. To provide better control of the current flow, 3D transistors have also been developed. A 3D transistor is an electronic switching device in which the planar semiconducting channel of a traditional FET is replaced by a semiconducting fin that extends outward, normal to the substrate surface. In such a device, the gate, which controls current flow in the fin, wraps around three sides of the fin so as to influence the current flow from three surfaces instead of one. The improved control achieved with a 3D design results in faster switching performance and reduced current leakage, which allows 3D transistors to consume less power so that they can operate at a lower supply voltage.

More recently, another type of 3D transistor has been developed for technology nodes below 10 nm, referred to as a gate-all-around (GAA) FET, in which the gate surrounds all four sides of the current channel so as to influence the current flow from every direction, and reduce short channel effects (SCE). Instead of providing a fin, in a GAA FET the current channel takes the form of one or more silicon nanowires coupling the source and drain regions.

The exemplary embodiments of the present invention employ the GAA FET by forming a self-aligned bottom contact utilizing space at the cell boundary of the GAA FET.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
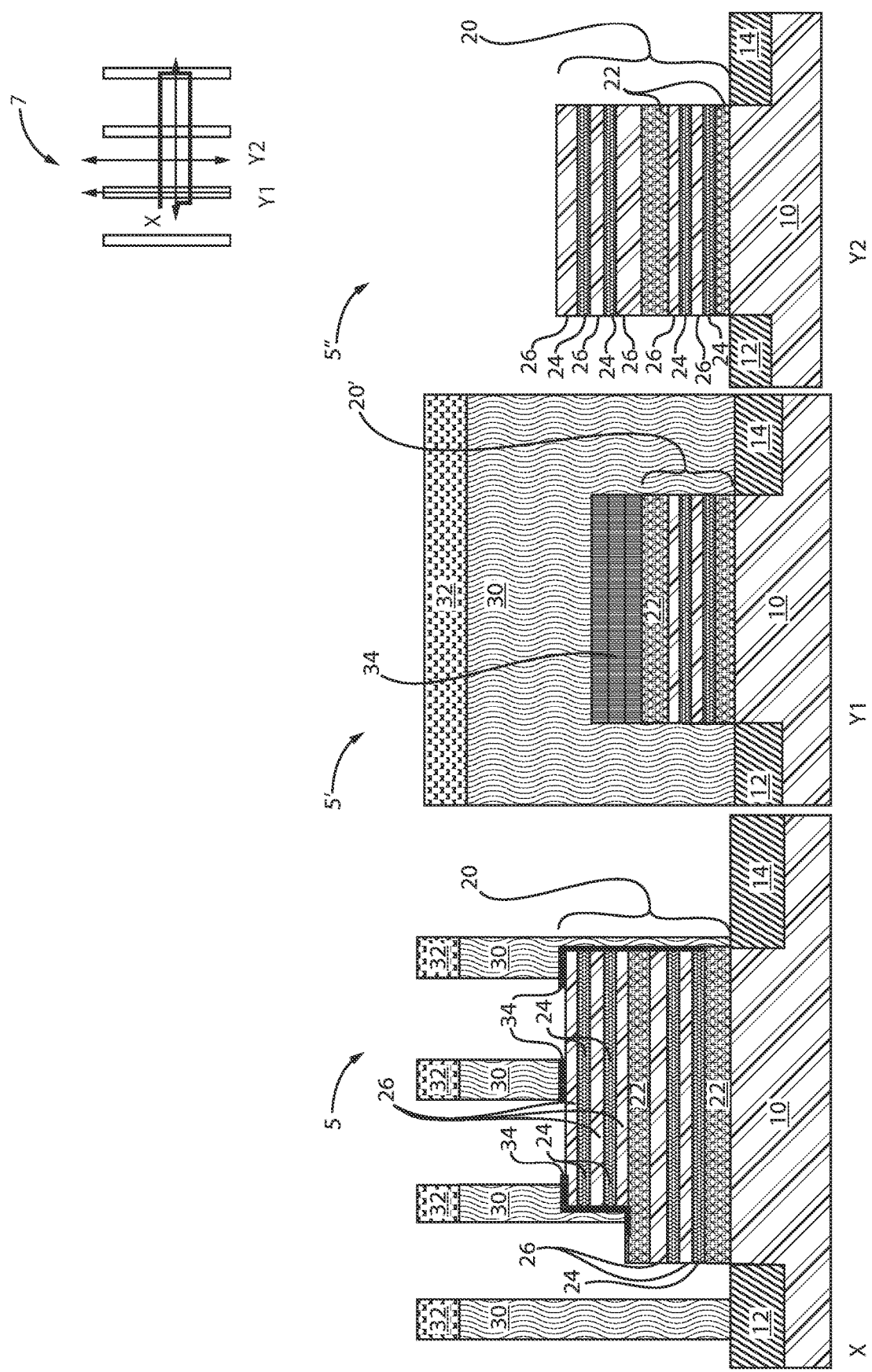
FIG. 1 is a cross-sectional view of a semiconductor structure including a stacked gate-all-around (GAA) field effect transistor (FET) formed over a substrate, in accordance with an embodiment of the present invention.

FIG. 1 is a cross-sectional view of a semiconductor structure including a stacked gate-all-around (GAA) field effect transistor (FET) formed over a substrate, in accordance with an embodiment of the present invention.

In various example embodiments, a semiconductor structure 5 includes shallow trench isolation (STI) regions 12, 14 formed within a substrate 10. A nanosheet stack 20 can be formed over the substrate 10 and can include alternating layers of several semiconductor layers.

In one example, a first semiconductor layer 22 is formed over the substrate 10. The first semiconductor layer 22 can be, e.g., silicon germanium (SiGe) with a high concentration of Ge. In one example, the Ge content can be about 60%. One skilled in the art can contemplate higher concentrations of Ge. This first semiconductor layer 22 can be referred to as a bottom first semiconductor layer 22.

A first stack of alternating layers of a second semiconductor layer 24 and a third semiconductor layer 26 can then be formed over the first semiconductor layer 22. The second semiconductor layer 24 can be, e.g., silicon germanium (SiGe) and the third semiconductor layer 26 can be, e.g., silicon (Si). The second semiconductor layer 24 can include SiGe with a low concentration of Ge. In one example, the Ge content can be about 30%. One skilled in the art can contemplate lower concentrations of Ge.

After the first stack of alternating second and third semiconductor layers 24, 26 are formed over the first semiconductor layer 22, another semiconductor layer 22 (top semiconductor layer 22) can be formed over the first stack of alternating second and third semiconductor layers 24, 26. Thus, the alternating second and third semiconductor layers 24, 26 can be formed between two first semiconductor layers 22 (each having a high concentration of Ge, e.g., 60%).

Subsequently, a second stack of alternating second and third semiconductor layers 24, 26 can be formed over the top first semiconductor layer 22.

Spacers 34 can then be constructed over the second stack of alternating second and third semiconductor layers 24, 26. In one example, three spacers 34 are shown. The left-hand spacer 34 has a substantially stepped configuration. The central spacer 34 has a substantially flat configuration. The right-hand side spacer 34 has a substantially inverted L-shaped configuration. The first spacer 34 (left-hand side) contacts the second stack of alternating second and third semiconductor layers 24, 26. The second spacer 34 (center) directly contacts a top surface of the second stack of alternating second and third semiconductor layers 24, 26. The third spacer 34 (right-hand side) contacts both the first and second stacks of alternating second and third semiconductor layers 24, 26. The spacer 34 (right-hand side) directly contacts both the top and bottom first semiconductor layers 22.

A plurality of fins 30 including hardmasks 32 thereon are formed over the nanosheet stack 20 and the STI regions 12.

Structure 5' is a cross-sectional view along line Y1. Structure 5' illustrates the spacer 34 formed over the first nanosheet stack, as well as the fin 30 with hardmask 32.

Structure 5" is a cross-sectional view along line Y2. Structure 5" illustrates the nanosheet stack 20 including the first stack of alternating second and third semiconductor layers 24, 26 separated from the second stack of alternating second and third semiconductor layers 24, 26 by the top first semiconductor layer 22.

Top view 7 illustrates the cuts along lines X, Y1 and Y2.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The shallow trench isolation (STI) regions 12 can be formed by etching a trench in doped bottom source/drain (S/D) regions (not shown) utilizing a conventional dry etching process such as reactive ion etching (RIE) or plasma etching. The trenches can optionally be lined with a conventional liner material, e.g., silicon nitride or silicon oxynitride, and then chemical vapor deposition (CVD) or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

Referring to, e.g., the nanosheet stack 20, although it is specifically contemplated that the second semiconductor layers 24 can be formed from silicon germanium and that the third semiconductor layers 26 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor layers 24/26 can be deposited by any appropriate mechanism. It is specifically contemplated that the semiconductor layers 24/26 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

The fins 30 can be formed from a semiconductor material including, but not limited to Si, strained Si, Si:C, SiGe, SiGe:C, Si alloys, Ge, Ge alloys, GaAs, InAs, InP, as well as other III/V and II/VI compound semiconductors. The fins 30 can be etched by employing, e.g., a reactive ion etch (RIE) or the like.

The hardmask materials can include any of one or more of SiN, SiCN, SiBN and/or SiBCN, among other materials. The hardmask 32 can be an oxide, for example, a silicon oxide hardmask. The hardmask 32 can be patterned by any suitable patterning techniques, including but not limited to, lithography followed by etching, sidewall image transfer (SIT), self-aligned double patterning (SADP), self-aligned multiple patterning (SAMP), self-aligned quadruple patterning (SAQP), or any suitable combination of those techniques.

The spacers 34 can include any of one or more of SiN, SiBN, SiCN and/or SiBCN films.

Figure 2:
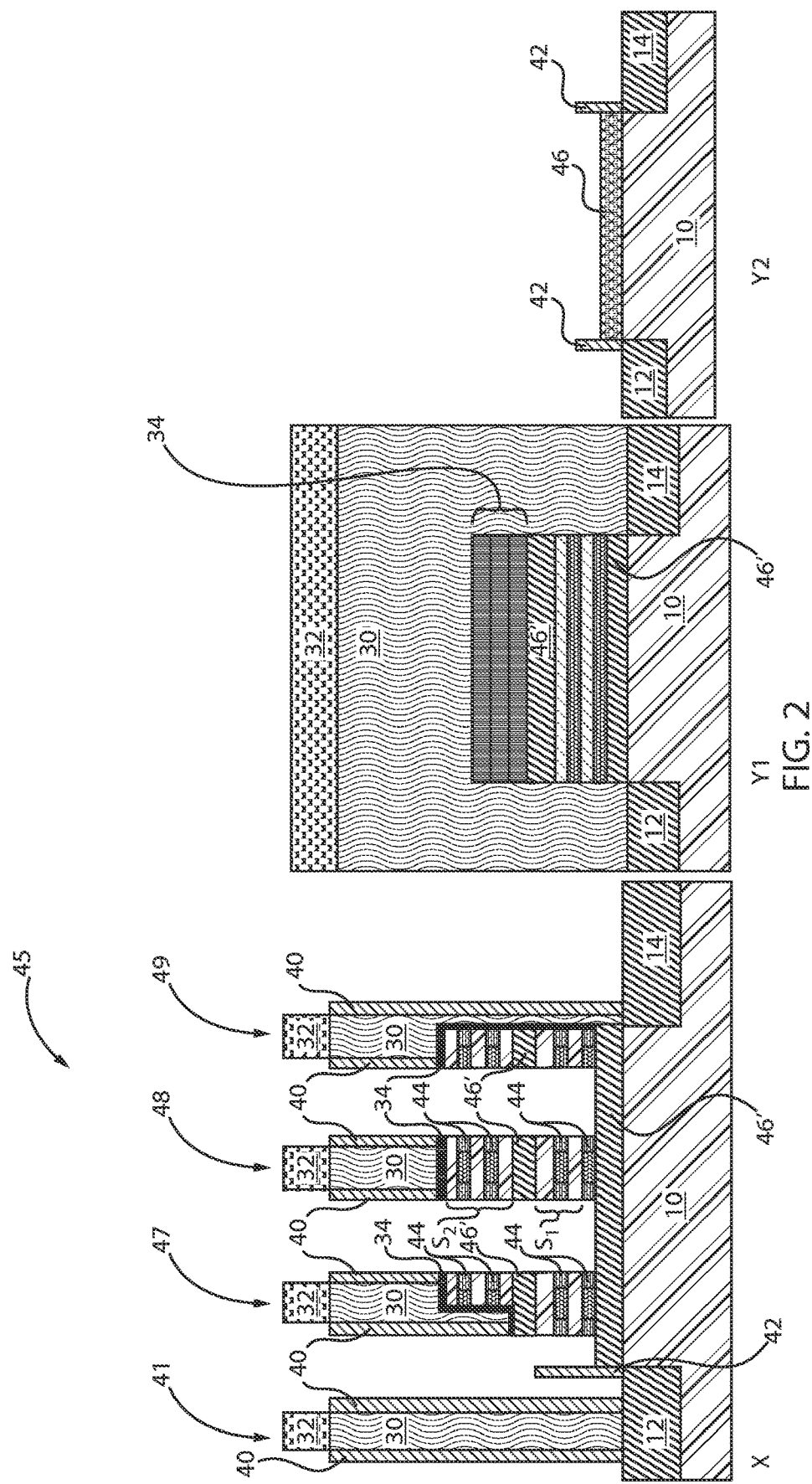
FIG. 2 is a cross-sectional view of the semiconductor structure of FIG. 1 where gate spacers are formed adjacent the fins and inner spacers are formed in the nanosheets, in accordance with an embodiment of the present invention.

FIG. 2 is a cross-sectional view of the semiconductor structure of FIG. 1 where gate spacers are formed adjacent the fins and inner spacers are formed in the nanosheets, in accordance with an embodiment of the present invention.

In various exemplary embodiments, the first and second stacks of nanosheet stack 20 are etched and gate spaces 40 are formed adjacent the plurality of fins 30. Additionally, a single gate spacer 42 (or barrier spacer 42) is formed on the STI region 12. The barrier spacer 42 extends a height of the first stack S1. The barrier spacer 42 extends to a bottom surface of the oxide 46'.

Moreover, inner spacers 44 are formed in the nanosheet stack 20 after etching.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The top and bottom first semiconductor layers 22 are replaced with an oxide 46'. The oxide 46' separates the first stack 51 from the second stack S2.

As a result, a stacked FET 45 is formed having different fin structures 41, 47, 48, 49.

The Y1 cut illustrates the spacer 34 formed over the oxide 46'.

The Y2 cut illustrates the barrier spacers 42 on opposed ends of the oxide 46'.

Figure 3:
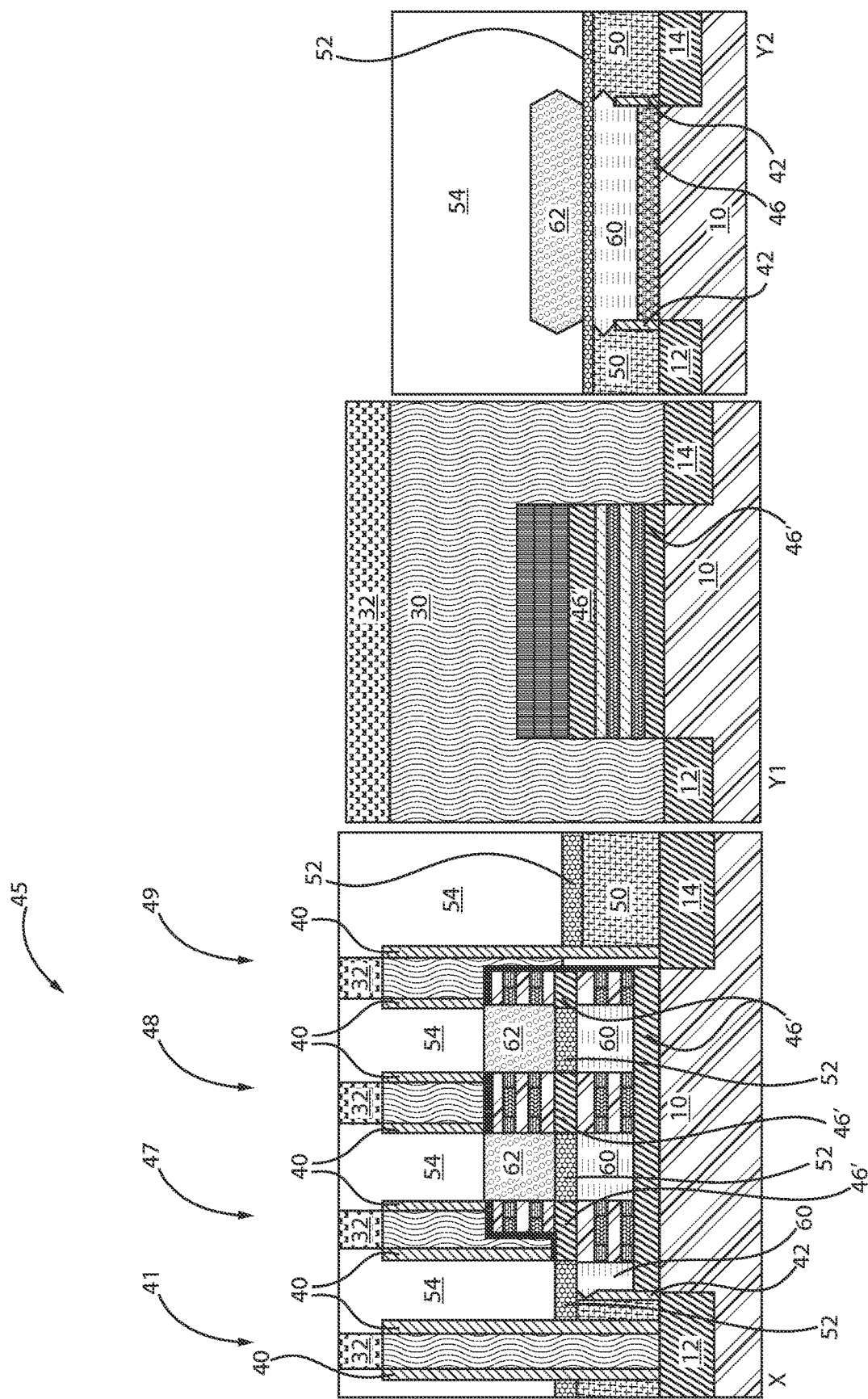
FIG. 3 is a cross-sectional view of the semiconductor structure of FIG. 2 where n-type and p-type epitaxial regions are formed and an epi spacer is formed therebetween, in accordance with an embodiment of the present invention.

FIG. 3 is a cross-sectional view of the semiconductor structure of FIG. 2 where n-type and p-type epitaxial regions are formed and an epi spacer is formed therebetween, in accordance with an embodiment of the present invention.

In various exemplary embodiments, n-type epitaxial regions 60 are formed over the oxide 46'. An epitaxial spacer 52 is then formed over the n-type epitaxial regions 60. P-type epitaxial regions 62 are then formed over the epitaxial spacer 52. The n-type epitaxial regions 60 and the p-type epitaxial regions 62 are formed between the fin structures 47, 48, 49.

Additionally, a first dielectric 50 is formed over the STI regions 12 and 14. A second dielectric 54 is formed over the epitaxial spacer 52. Thus, the second dielectric 54 is separated from the first dielectric 50 by the epitaxial spacer 52.

It is noted that the barrier spacer 42 is disposed between a portion of the first dielectric 50 and one of the n-type epitaxial regions 60. The barrier spacer 42 prevents the one n-type epitaxial region 60 from extending onto STI region 12.

The n-type epitaxial regions 60 directly contact the sidewalls of the first stack S1, whereas the p-type epitaxial regions 62 directly contact the sidewalls of the second stack S2. The epitaxial spacer 52 directly contacts sidewalls of the oxide 46'.

The Y2 cut clearly illustrates the epitaxial spacer 52 separating the n-type epitaxial regions 60 from the p-type epitaxial regions 62. Moreover, the epitaxial spacer 52 separates the first dielectric 50 from the second dielectric 54. The n-type epitaxial regions 60 extends onto a top surface of the barrier spacer 42.

Figure 4:
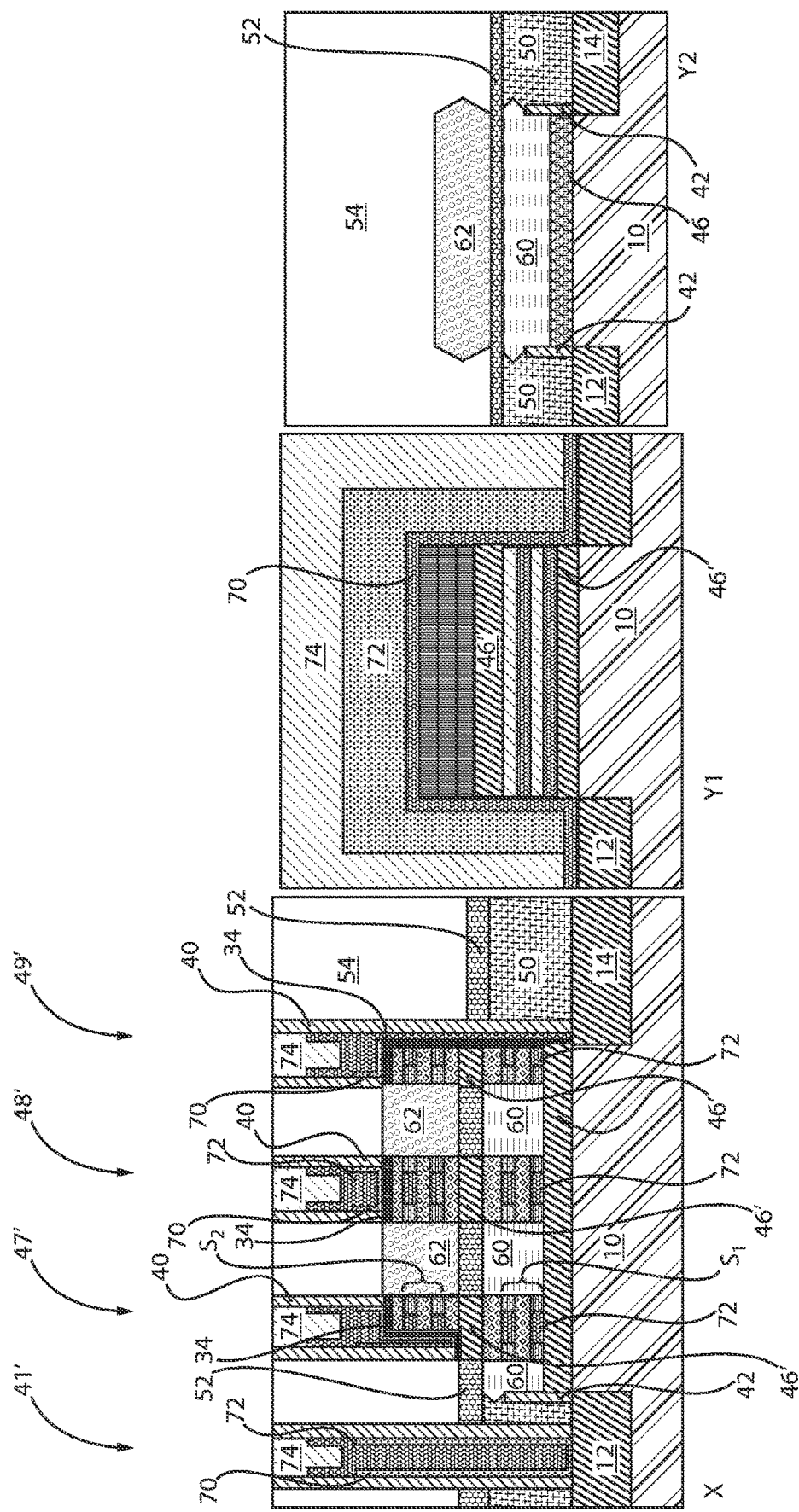
FIG. 4 is a cross-sectional view of the semiconductor structure of FIG. 3 where replacement metal gate (RMG) work function metal (WFM) formation takes place, in accordance with an embodiment of the present invention.

FIG. 4 is a cross-sectional view of the semiconductor structure of FIG. 3 where replacement metal gate (RMG) work function metal (WFM) formation takes place, in accordance with an embodiment of the present invention.

In various exemplary embodiments, the fins 30 and the hardmask 32 are removed and replaced with a WFM. Each fin structure 41', 47', 48', 49' includes a different configuration.

The gate spacers 40 are thus filled with an inter-layer dielectric (ILD) 70, a high-k material 72, and a WFM 74.

Fin structure 41' extends to a top surface of the STI region 12. The ILD 70 directly contacts the top surface of the STI region 12. The ILD 70 defines a substantially elongated U-shaped configuration. The high-k material 72 is formed within the ILD 70. At a top portion of the fin structure 41', the high-k material 72 directly contacts inner sidewalls of the gate spacer 40. The WFM 74 directly contacts inner sidewalls of the gate spacer 40 and extends into a U-shaped area defined at the top of the high-k material 72.

Fin structure 47' extends over the nanosheet stack. Fin structure 47' includes a spacer 34 (inverted Z-shaped configuration). The spacer 34 separates the ILD 70 from the stack S2. The fin structure thus defines a stepped configuration.

Fin structure 48' extends over the nanosheet stack. Fin structure 48' includes a spacer 34 that is substantially flat. As a result, the ILD 70 has a substantially U-shaped configuration for accommodating the high-k material 72. At a top portion of the fin structure 48', the high-k material 72 directly contacts inner sidewalls of the gate spacer 40. The WFM 74 directly contacts inner sidewalls of the gate spacer 40 and extends into a U-shaped area defined at the top of the high-k material 72.

Fin structure 49' extends over the nanosheet stack. Fin structure 49' includes a spacer 34 that defines an inverted L-shape. The spacer 34 extends an entire length of the nanosheet stack. As a result, the ILD 70 and the high-k material encompassed within the ILD 70 both extend a length of the nanosheet stack. The ILD 70 directly contacts a top surface of the STI region 14.

In some examples, the selective wet etch or the selective dry etch can selectively remove the portions of second semiconductor layer 24 (e.g., the SiGe layer) and leave the entirety or portions of the third semiconductor layer 26. The removal creates gaps or openings or indentations between the third semiconductor layers 26 of the FET device. These openings are filled with the high-k material 72.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

The ILD 70 can be any suitable material, such as, for example, porous silicates, carbon doped oxides, silicon dioxides, silicon nitrides, silicon oxynitrides, or other dielectric materials. Any known manner of forming the ILD 70 can be utilized. The ILD 70 can be formed using, for example, CVD, PECVD, ALD, flowable CVD, spin-on dielectrics, or PVD.

In various embodiments, the high-k material 72 can include but is not limited to work function metals such as titanium nitride, titanium carbide, titanium aluminum carbide, tantalum nitride and tantalum carbide; conducting metals such as tungsten, aluminum and copper; and oxides such as silicon dioxide ($SiO_2$), hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

The WFM 74 or conductive material 74, can be, e.g., tungsten (W).

Figure 5:
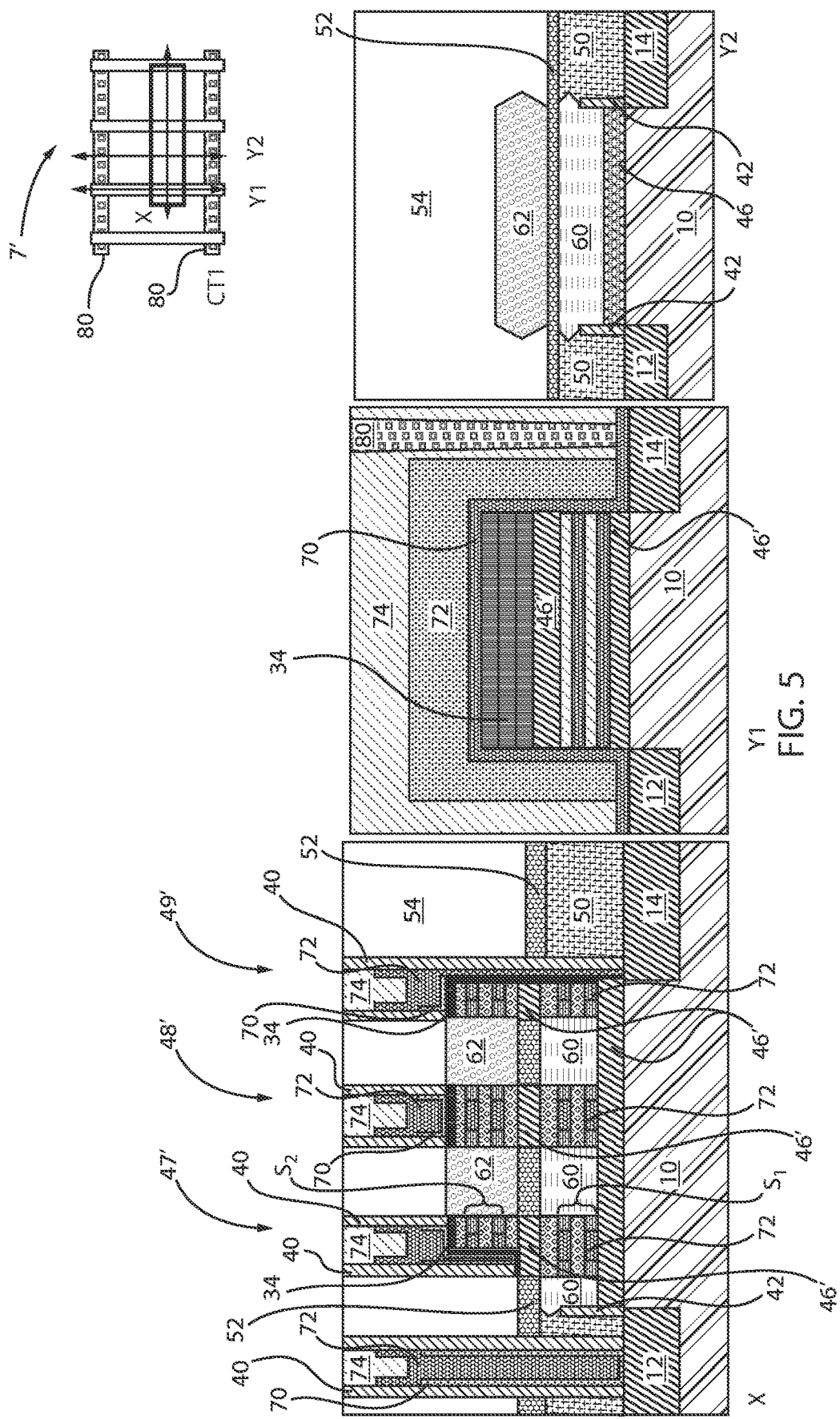
FIG. 5 is a cross-sectional view of the semiconductor structure of FIG. 4 where a first cut is performed, in accordance with an embodiment of the present invention.

FIG. 5 is a cross-sectional view of the semiconductor structure of FIG. 4 where a first cut is performed, in accordance with an embodiment of the present invention.

In various exemplary embodiments, a first cut 80 is performed. This is clearly illustrated along line Y1.

Figure 6:
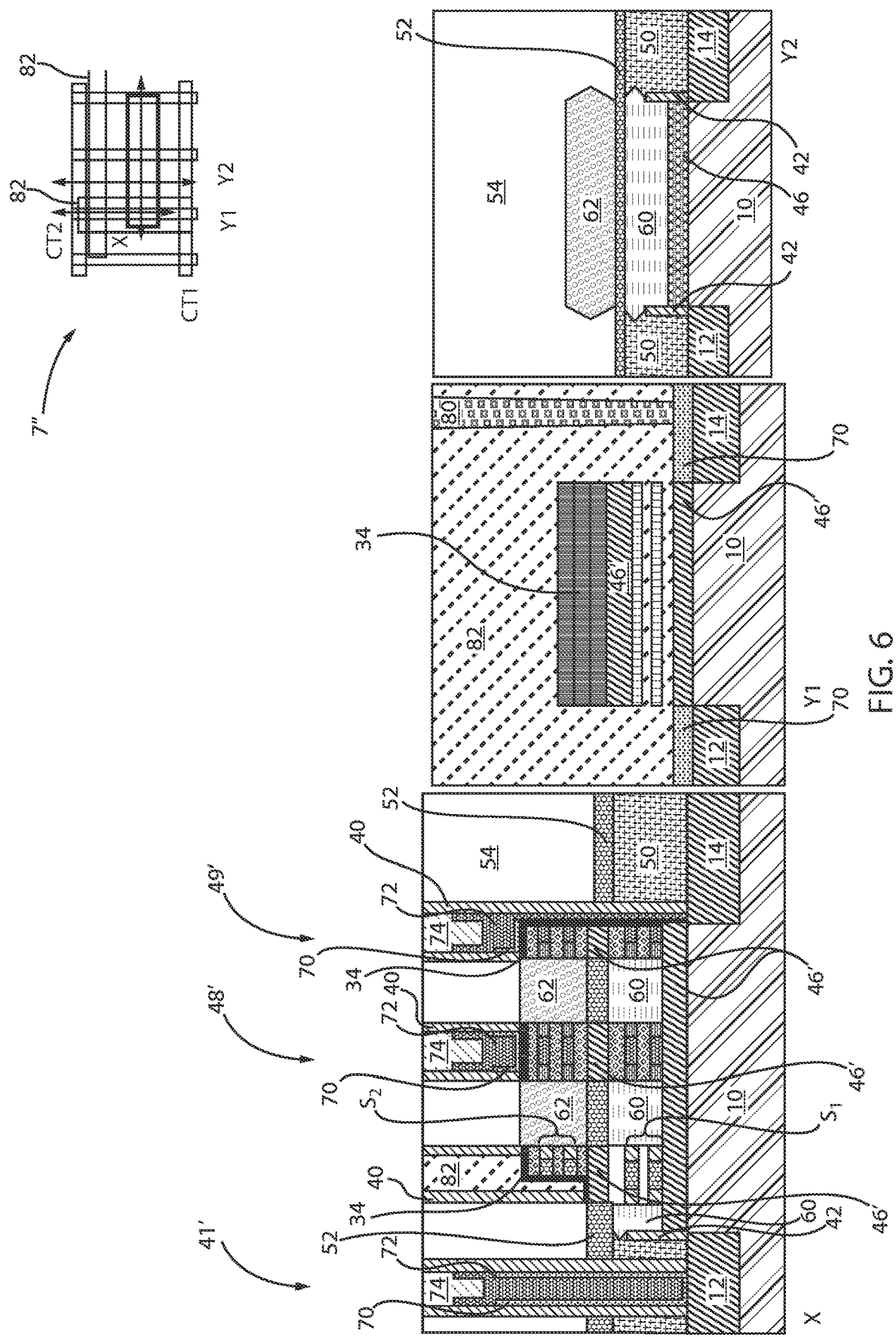
FIG. 6 is a cross-sectional view of the semiconductor structure of FIG. 5 where a second cut is performed, in accordance with an embodiment of the present invention.

FIG. 6 is a cross-sectional view of the semiconductor structure of FIG. 5 where a second cut is performed, in accordance with an embodiment of the present invention.

In various exemplary embodiments, a second cut 82 is performed. This is illustrated in the X direction and in the Y1 direction. In the Y1 direction, the second cut 82 encompasses the entire spacer 34. In the X direction, the second cut 82 removes the ILD 70, the high-material 72, and the WFM 74 from where the fin structure 47' was positioned.

Figure 7:
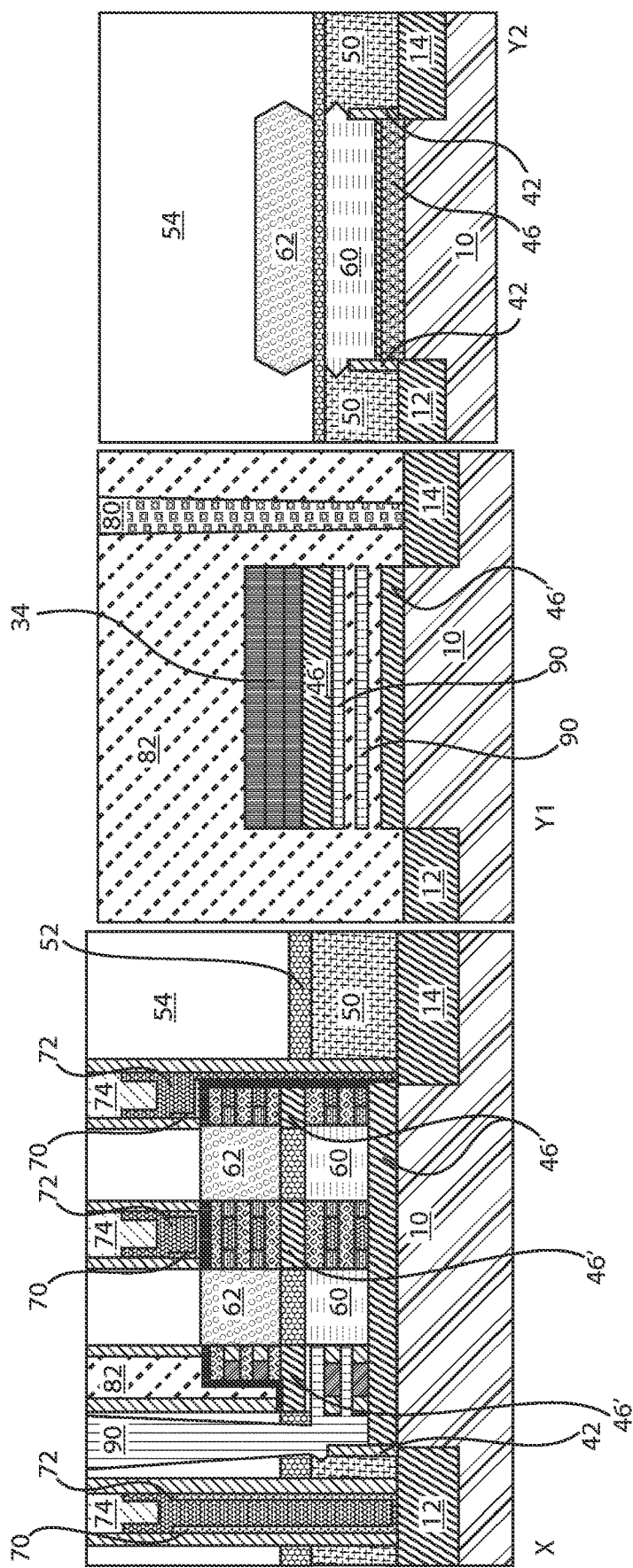
FIG. 7 is a cross-sectional view of the semiconductor structure of FIG. 6 where a first contact is formed, in accordance with an embodiment of the present invention.

FIG. 7 is a cross-sectional view of the semiconductor structure of FIG. 6 where a first contact is formed, in accordance with an embodiment of the present invention.

In various exemplary embodiments, a first contact 90 is formed. The first contact 90 is positioned between the fin structure 41' and the second cut 82. The first contact 90 extends laterally underneath the cut 82. The first contact 90 can be referred to as the bottom contact.

Figure 8:
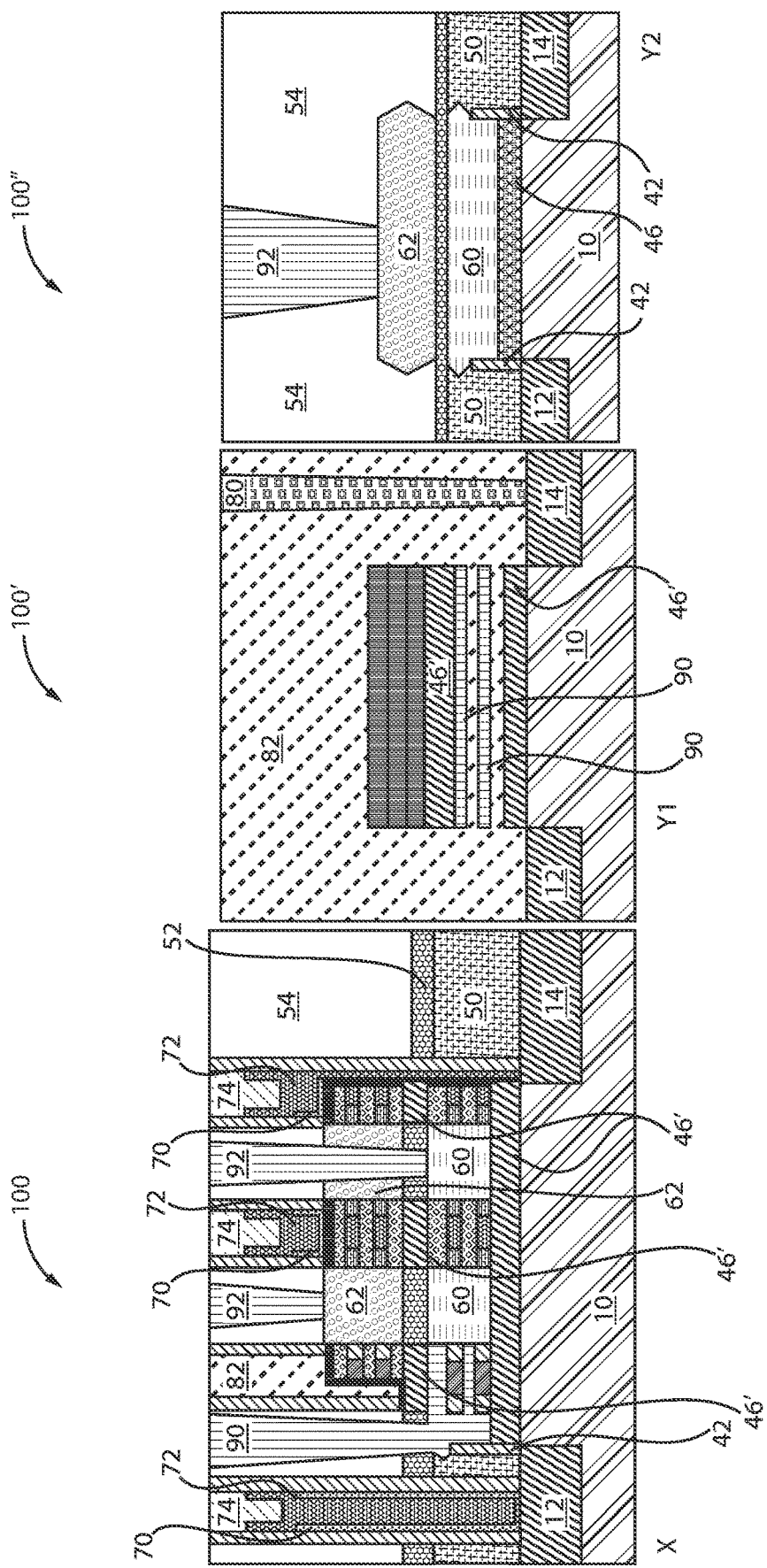
FIG. 8 is a cross-sectional view of the semiconductor structure of FIG. 7 where a pair of second contacts are formed, in accordance with an embodiment of the present invention.

FIG. 8 is a cross-sectional view of the semiconductor structure of FIG. 7 where a pair of second contacts are formed, in accordance with an embodiment of the present invention.

In various exemplary embodiments, a pair of second contacts 92 are formed. One of the second contacts 92 extends to a top surface of a p-type epitaxial region 62 and a different second contact 92 extends into a different p-type epitaxial region 62, such that it contacts the n-type epitaxial region 60. This occurs between fin structures 48', 49'.

Structure 100 illustrates the X direction cut, structure 100' illustrates the Y1 direction cut, and structure 100" illustrates the Y2 direction cut.

Figure 9:
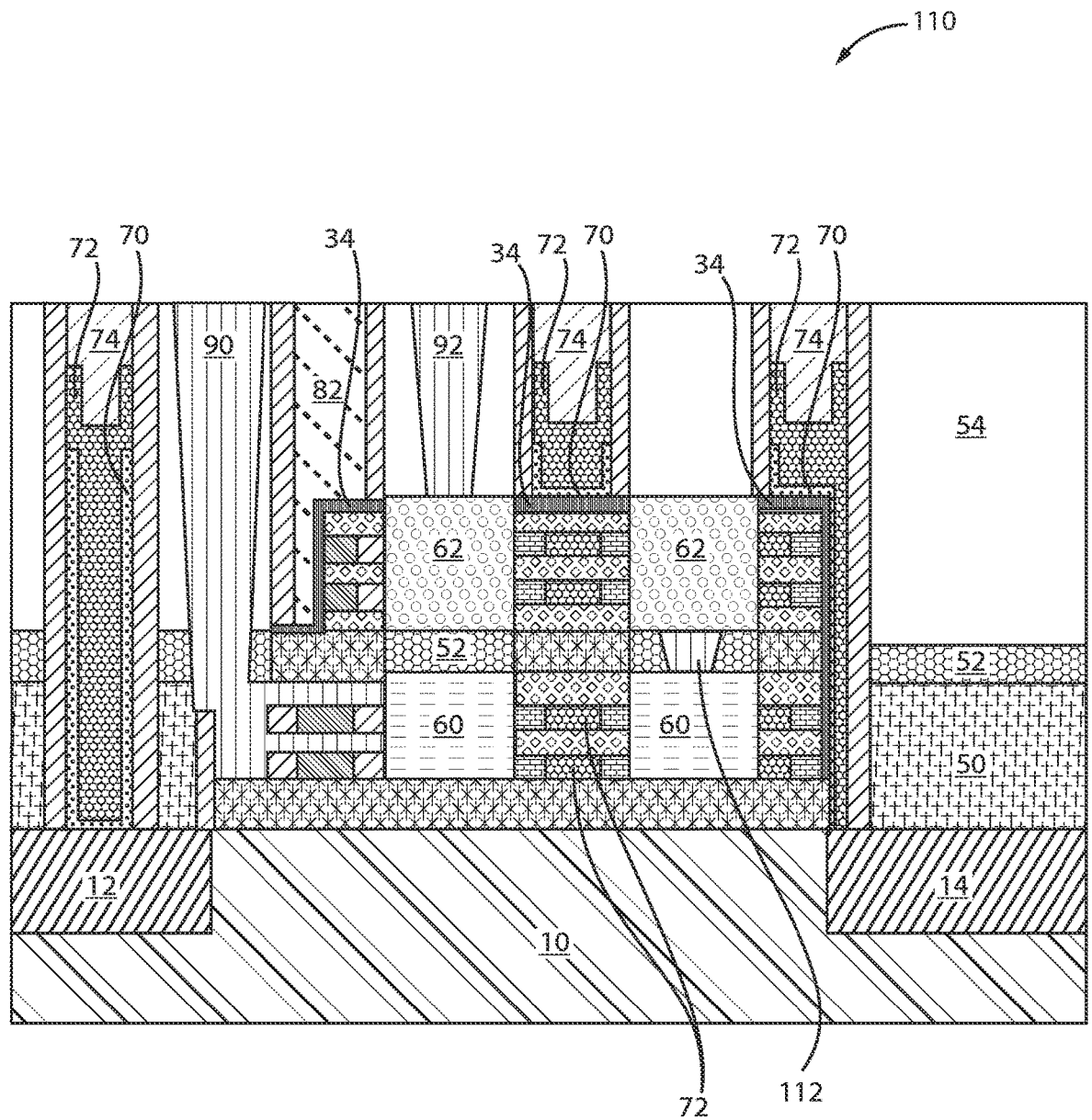
FIG. 9 is a cross-sectional view of the semiconductor structure of FIG. 8 where a buried strap is formed between the n-type and p-type epitaxial regions, in accordance with another embodiment of the present invention.

FIG. 9 is a cross-sectional view of the semiconductor structure of FIG. 8 where a buried strap is formed between the n-type and p-type epitaxial regions, in accordance with another embodiment of the present invention.

In an alternative exemplary embodiment, a buried strap 112 can be formed directly between the n-type epitaxial region 60 and the p-type epitaxial region 62.

In conclusion, a self-aligned to gate, bottom contact is formed by utilizing space at the cell boundary on a stacked GAA FET. The semiconductor device includes a stacked gate all around FET standard cell with contact to bottom FET formed past dummy gate at the edge of the cell, a step sheet structure across the gate plane, partial extension of the bottom sheet past the end gate (no tuck thereunder), contact to the bottom gate through sacrificial epi/sheet under the dummy gate, and self-aligned dummy gate isolation of the top sheet from the bottom contact. The method includes a stepped RX structure in through PC plane with tuck under the top sheet, bottom sheet extending past PC, formation of N/P epi as POR with partial unmerged p-epi in bottom RX region extending past the PC, cut of cell end non-active gate with special CT (post sheet release and RMG) and fill with SiN, bottom contact etch landing on unmerged epi, removal of unmerged epi, and isotropic etch of unmerged epi and Si sheets under cell edge gate.

Regarding FIGS. 1-9, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming a bottom contact for a stacked gate-all-around (GAA) field effect transistor (FET) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for constructing a semiconductor device, the method comprising:
  forming a plurality of fins over a nanosheet stack and a substrate;
  forming spacers between the nanosheet stack and one or more of the plurality of fins, each spacer defining a different shape;
  forming gate spacers adjacent the plurality of fins, the gate spacers directly contacting the one or more of the plurality of fins having a spacer;
  forming a barrier spacer between a set of fins of the plurality of fins, the barrier spacer directly contacting a top surface of a shallow trench isolation (STI) region;
  forming n-type epitaxial regions between the plurality of fins;
  forming p-type epitaxy regions over the n-type epitaxial regions; and
  forming a first contact extending vertically through the semiconductor device adjacent the barrier spacer and extending laterally away from the barrier spacer to directly contact a sidewall of an n-type epitaxial region of the n-type epitaxial regions.

2. The method of claim 1, wherein each of the plurality of fins formed over the nanosheet stack has a different shape.

3. The method of claim 1, wherein an epitaxial spacer separates the n-type epitaxial regions from the p-type epitaxy regions.

4. The method of claim 1, further comprising replacing the plurality of fins with work function metal (WFM) after formation of the p-type epitaxy regions.

5. The method of claim 1, wherein a first spacer of the spacers formed between the nanosheet stack and one or more of the plurality of fins defines a substantially stepped configuration.

6. The method of claim 1, wherein a second spacer of the spacers formed between the nanosheet stack and one or more of the plurality of fins is substantially flat.

7. The method of claim 1, wherein a third spacer of the spacers formed between the nanosheet stack and one or more of the plurality of fins defines a substantially inverted L-shaped configuration.

8. The method of claim 1, wherein a second contact is formed to a top surface of a p-type epitaxial region of the p-type epitaxial regions.

9. The method of claim 1, wherein a third contact is formed through a p-type epitaxial region of the p-type epitaxial regions to a top surface of a respective n-type epitaxial region of the n-type epitaxial regions.

10. A method for constructing a stacked gate-all-around field effect transistor (GAA FET), the method comprising:
  forming a plurality of fins over a nanosheet stack and a substrate;
  forming barrier spacers over shallow trench isolation (STI) regions;
  forming n-type epitaxial regions between the plurality of fins;
  forming p-type epitaxy regions over the n-type epitaxial regions; and
  forming a first contact extending vertically through the GAA FET and extending laterally away from the barrier spacers to directly contact a sidewall of an n-type epitaxial region of the n-type epitaxial regions.

11. The method of claim 10, further comprising forming spacers between the nanosheet stack and one or more of the plurality of fins.

12. The method of claim 11, wherein each spacer defines a different shape.

13. The method of claim 11, wherein a first spacer of the spacers formed between the nanosheet stack and one or more of the plurality of fins defines a substantially stepped configuration.

14. The method of claim 11, wherein a second spacer of the spacers formed between the nanosheet stack and one or more of the plurality of fins is substantially flat.

15. The method of claim 11, wherein a third spacer of the spacers formed between the nanosheet stack and one or more of the plurality of fins defines a substantially inverted L-shaped configuration.

16. The method of claim 10, wherein an epitaxial spacer separates the n-type epitaxial regions from the p-type epitaxy regions.

17. The method of claim 10, further comprising replacing the plurality of fins with work function metal (WFM) after formation of the p-type epitaxy regions.

18. The method of claim 10,
  wherein a second contact is formed to a top surface of a first p-type epitaxial region of the p-type epitaxial regions; and
  wherein a third contact is formed through a second p-type epitaxial region of the p-type epitaxial regions to a top surface of a respective n-type epitaxial region of the n-type epitaxial regions.

19. A stacked gate-all-around field effect transistor (GAA FET) comprising:
  barrier spacers disposed over shallow trench isolation (STI) regions;
  n-type epitaxial regions formed between the plurality of fins;
  p-type epitaxy regions formed over the n-type epitaxial regions; and
  a first contact extending vertically through the GAA FET and extending laterally away from the barrier spacers to directly contact a sidewall of an n-type epitaxial region of the n-type epitaxial regions.

20. The stacked GAA FET of claim 19, wherein spacers are disposed between the nanosheet stack and one or more of the plurality of fins, each spacer defining a different shape.

* * * * *